(12) United States Patent
Nurminen

(10) Patent No.: US 7,190,056 B2
(45) Date of Patent: Mar. 13, 2007

(54) THERMALLY ENHANCED COMPONENT INTERPOSER: FINGER AND NET STRUCTURES

(75) Inventor: Janne T Nurminen, Finland (FI)

(73) Assignee: Nokia Corporation, Espoo (FI)

( * ) Notice: Subject to any disclaimer, the term of this patent is extended or adjusted under 35 U.S.C. 154(b) by 151 days.

(21) Appl. No.: 10/815,583

(22) Filed: Mar. 31, 2004

(65) Prior Publication Data

US 2005/0224933 A1    Oct. 13, 2005

(51) Int. Cl.
*H01L 21/48* (2006.01)
(52) U.S. Cl. .................. 257/676; 257/691; 438/123
(58) Field of Classification Search ............. None
See application file for complete search history.

(56) References Cited

U.S. PATENT DOCUMENTS

| 5,027,191 | A | | 6/1991 | Bourdelaise et al. | 387/74 |
| 5,594,234 | A | * | 1/1997 | Carter et al. | 257/676 |
| 6,483,187 | B1 | | 11/2002 | Chao et al. | 257/712 |
| 6,525,942 | B2 | | 2/2003 | Huang et al. | 361/704 |

* cited by examiner

*Primary Examiner*—Leonardo Andujar
(74) *Attorney, Agent, or Firm*—Harrington & Smith, PC

(57) ABSTRACT

An IC package dissipates thermal energy using thermally and electrically conductive thermal fingers. The IC package includes a substrate material with a die pad area, which is suitable to support an integrated circuit. A plurality of solder ball pads is disposed on a first surface of the substrate material and a plurality of conductive thermal fingers encompass the die pad area to facilitate the dissemination of thermal energy from the die pad area to the substrate and/or printed wiring board.

18 Claims, 10 Drawing Sheets

ENHANCED DESIGN, TOP AND BOTTOM THERMAL FINGERS + THERMAL VIAS:

| TEMPERATURE (DEG.C) |
|---|
| 101.725 |
| 91.9124 |
| 82.0994 |
| 72.2864 |
| 62.4733 |
| 52.6603 |
| 42.8473 |
| 33.0343 |
| 23.2213 |
| 13.4063 |

~ 17% THERMAL PERFORMANCE DECREASE IN PACKAGE LEVEL

ENHANCED DESIGN, TOP THERMAL FINGERS AND BOTTOM NET + VIAS:

| TEMPERATURE (DEG.C) |
|---|
| 79.3609 |
| 72.033 |
| 64.7051 |
| 57.3773 |
| 50.0494 |
| 42.7215 |
| 35.3936 |
| 28.0658 |
| 20.7379 |
| 13.41 |

~ 35% THERMAL PERFORMANCE DECREASE IN PACKAGE LEVEL

THERMALLY ENHANCED COMPONENT INTERPOSER: FINGER AND NET STRUCTURES

TECHNICAL FIELD

This invention relates generally to dissipating thermal energy (heat) from a die pad. More particularly, this invention relates to a thermally enhanced interposer finger and net structure that reduces thermal resistance of a circuit package and integrates thermal dissipation and electrical conductivity to a particular pin.

BACKGROUND

In attempting to use the area on printed wiring boards (PWB) and printed circuit boards (PCB) more efficiently, semiconductor chip manufactures have been switching from larger, more cumbersome interconnection techniques, such as pin grid arrays ("PGAs") and perimeter leaded quad flat packs ("QFPs"), to smaller assemblies, such as ball grid arrays ("BGAs"). Using BGA technology, semiconductor chips are typically interconnected to their supporting substrates using solder connections. However, the columns of solder are generally designed to be relatively short to maintain the solder's structural integrity, which reduces elastic properties and results in increased susceptibility to solder cracking due to a differential between the coefficient of thermal expansion ("CTE") of the chip relative to the CTE of the supporting substrate. This is an important issue, since as the chip heats up during use, both the chip and the substrate expand; and when the heat is removed, both the chip and the substrate contract. The difference between the chip CTE and the substrate CTE can result in catastrophic deformation.

Therefore, the ability to dissipate heat that is generated from the operation of integrated circuits (IC) is a major design concern for the electronic industry. This is emphasized because the density of circuits on IC devices has increased substantially in recent years and the reliability and performance of these high density circuits are affected by the thermal environment. Additionally, size considerations require that an increased number of electronic packages be installed into very small spaces, which also greatly increases the need to efficiently dissipate heat from IC packages. As the features of semiconductor chips continue to be reduced in size, the number of chips packed into a given area will be greater and the heat dissipated by each of these chips will have a greater effect on the thermal mismatch problem discussed above.

Furthermore, IC devices are increasingly being used for high power applications. While many early IC chips operated below a few watts, ICs are being designed to operate around 10 watts, which substantially increases the need to effectively dissipate the heat. The increased temperature on the die and the package reduces reliability, as well as the life time of the device, due to thermo-mechanical fatigue.

In some conventional semiconductor packages the heat generated from a semiconductor chip or integrated circuit (IC), which is typically mounted on a die pad of a substrate, is emitted through two routes. The first route is through external connection terminals of the package, and the second route is through the surface of the package. In order to more effectively dissipate the heat, a heat sink can be attached to the package. In a BGA package, which includes an encapsulating resin molded around a semiconductor chip, the heat sink may be attached directly to the encapsulating resin. Thus, the heat generated from the chip is conducted to the heat sink via the encapsulant and dissipated to the outside by convection.

Other approaches to solve the problem of heat dissipation include adding additional thermal balls under the die area. However, this approach requires modification of the package design, and possibly a layout change as well. Another approach is to modify the package type and/or reduce the required power. These approaches are not satisfactory since they require major design changes.

Bourdelaise et al. disclose in U.S. Pat. No. 5,027,191, a chip carrier assembly utilizing a cavity down chip with a pad grid array. The IC chip within the chip carrier is mounted against a surface opposite the PWB to which the chip is attached such that heat transfer from the IC chip may occur along a short path to a heat sink to enable a larger heat transfer rate. The improvement of heat transfer rate is still quite limited due to a small gap that is usually required on the top surface of an IC chip to allow bonding wires to extend from the chip to connection pads surrounding the chip. This small gap between the IC chip and the flat thermal pad serving as a heat sink substantially reduces the heat transfer rate.

Huang et al. disclose in U.S. Pat. No. 6,525,942, a heat dissipation BGA package. The heat dissipation BGA package includes a plurality of first thermal ball pads formed on the underside of a substrate in the area covered by a chip. The BGA package also includes a plurality of second thermal ball pads or a heat dissipation ring outside the first thermal ball pads. A plurality of signal ball pads is formed outside the second thermal ball pads or the heat dissipation ring. The second thermal ball pads or heat dissipation ring is connected to the first thermal ball pads by conductive trace lines. A plurality of first thermal balls is attached to the respective first thermal ball pads and the signal balls are attached to the respective signal ball pads. The first thermal balls and the signal balls are in contact with corresponding contact points on a printed circuit board. A plurality of second thermal balls is attached to the respective second thermal ball pads or the surface of the heat dissipation ring. The heat dissipation disclosed in Huang is limited because the die pad conducts thermal energy to the first and second thermal balls only through the vias.

Chao et al. disclose in U.S. Pat. No. 6,483,187, a heat spread substrate that includes a metal heat spreader, which has a surface with a cavity that is adapted to support a die. The surface also includes a ground ring arranged at the periphery of the cavity, a substrate-supporting surface surrounding the periphery of the ground ring, a plurality of ground pads arranged at the periphery of the substrate-supporting surface and a plurality of ground pads arranged on the substrate-supporting surface and protruding from it. The substrate also has a plurality of through holes, a plurality of mounting pads and a plurality of ball pads. Chao discloses that a thickness decreasing process is carried out on one of the surfaces of the metal heat spreader to decrease the thickness of part of the areas on the surface. The thickness decreasing process can be accomplished by stamping processes, or by multi-photolithography and half-etching. One drawback to varying the thickness of the heat spreader to dissipate heat is that it requires specific fabrication steps to produce the desired heat spreader shape.

With the above limitations and difficulties, there is still a need in the art of IC packaging techniques to resolve these difficulties and limitations. Specifically, there is a need in the art to provide improved heat dissipation for high power ICs and meanwhile increase the packaging integrity.

SUMMARY OF THE PREFERRED EMBODIMENTS

The foregoing and other problems are overcome, and other advantages are realized, in accordance with the presently preferred embodiments of these teachings.

Accordingly, one embodiment of the present invention is directed to an integrated circuit package and a method of fabrication therefor. The package includes a substrate material and a die pad area, which has dimensions suitable to mount an integrated circuit. A plurality of thermally and electrically conductive integrated thermal heat transfer elements (fingers) are integrated in the component substrate material outside the die pad area and a plurality of vias are disposed under the die pad area. The vias provide thermal and electrical conductivity from the first surface of the substrate material to the second surface of the substrate material. A plurality of electrically and thermally conductive heat transfer elements are extended out outwardly from the die pad and flag areas, surrounding the area of the first signal pad row, and each of the conductive heat transfer elements conduct thermal energy from the substrate through one or more of the vias, and also conduct electrical signals.

Another embodiment of the present invention is directed to the integrated circuit package and method as described above, and further including a full net, also referred to herein as a thermally conductive plane, of thermal heat transfer elements disposed on the second or bottom surface of the substrate material and outside the die pad area. One or more of the thermal heat transfer elements are in thermal contact with an associated via, and the thermal heat transfer elements conduct electrical signals.

Yet another embodiment of the present invention is directed to the integrated circuit package and method as described above that also includes a printed wiring board on which the substrate is mounted. Thermal energy is dissipated from the die pad area to the printed wiring board through the thermal heat transfer elements.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 1:
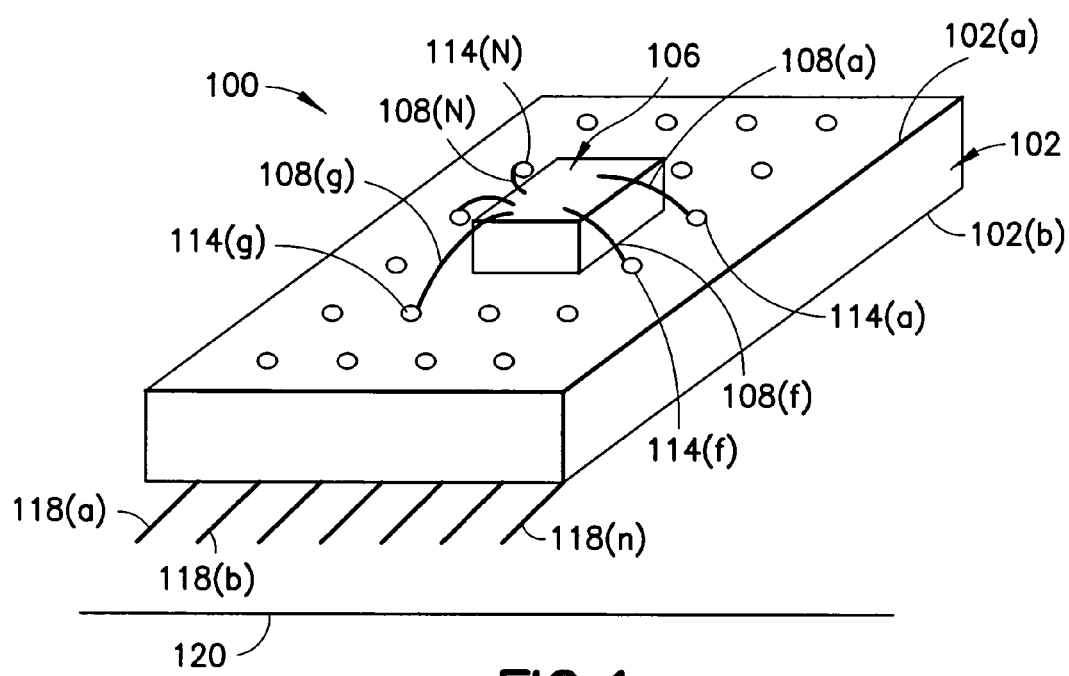
FIG. 1 shows an IC package mounted on a printed circuit board.

By way of introduction to the preferred embodiments of this invention, reference is first made to FIG. 1, for showing a conventional IC package 100, which includes substrate 102 and IC chip 106. The IC package 100 is mounted on PCB or PWB 120, typically via interconnectors 118(a) . . . (n), where n is any suitable number that comports with the design of the IC package 100.

The IC chip 106 is mounted on substrate 102 typically by epoxy or resin suitable to adhere IC chip 106 to a die pad area of substrate 102. Preferably, the material used to adhere chip 106 to substrate 102 has acceptable thermal conductive properties. Wires 108(a) . . . (n), where n is any suitable number, electrically connect portions of IC chip 106 to selected ones of solder ball pads 114(a) . . . (n), where n is any suitable number. A solder ball may be mounted on a corresponding solder ball pad to electrically connect the wire 108 to another location. The substrate 102 has a first surface 102(a) (a chip-facing surface) and a second surface 102(b) (a PWB-facing surface).

Figure 2:
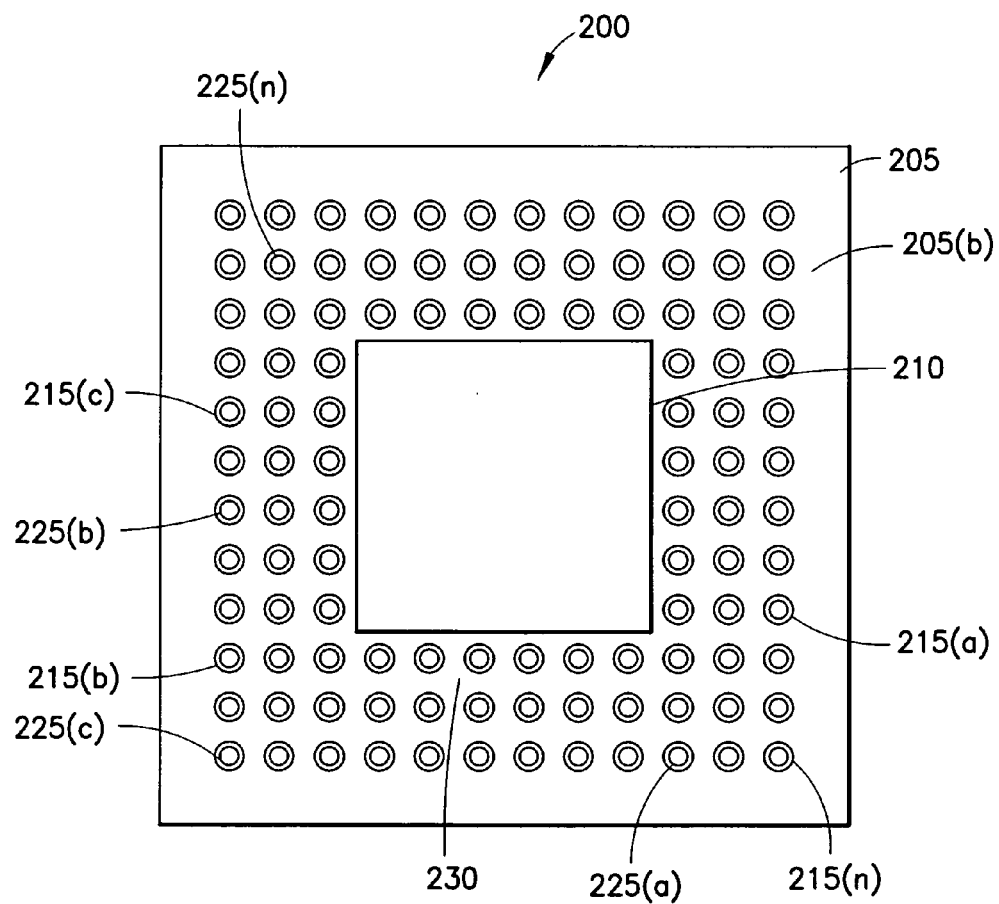
FIG. 2 shows a conventional substrate from the solder ball side.

FIG. 2 shows a view 200 of a conventional substrate from the solder ball side, or PWB facing surface 205(b). The substrate 205 has a die pad area 210 mounted on surface 205(b). Solder ball pads 215(a) . . . (n), generally 215, support an associated thermally conductive solder ball (not shown), which disseminates thermal energy. A corresponding via, through bore or hole 225(a) . . . (n), generally, 225, facilitates the dissemination of thermal energy (heat) by providing a path for the thermal energy through the substrate material 205. It is an embodiment of the invention that each solder ball pad 215 may have a corresponding via. As shown in FIG. 2, the die pad 210 is thermally insulated from the solder ball pads 215, by thermally insulating material 230. This design reduces the efficiency of removing thermal energy (heat) that is generated by an IC chip mounted on die pad area 210.

Figure 3:
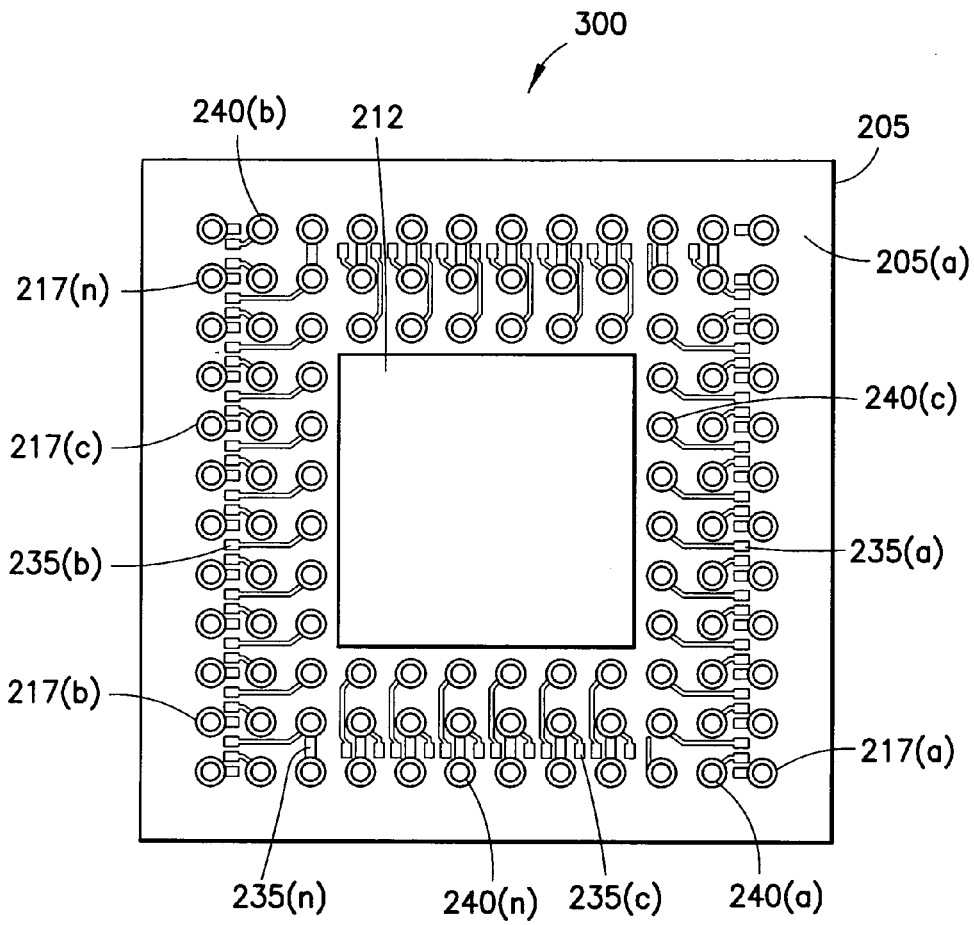
FIG. 3; shows a conventional substrate from an upper side.

FIG. 3 shows a view 300 of a conventional substrate 205 from a chip-facing side. The substrate 205 has an upper surface 205(a) on which a die pad area 212 is mounted. Top layer via pads 217(a) . . . (n), generally 217, and circuit traces 235(a) . . . (n), generally 235 are also shown. Vias, through bores or holes, 240(a) . . . (n), generally 240, enable thermal energy to conduct through the substrate 205.

Figure 4:
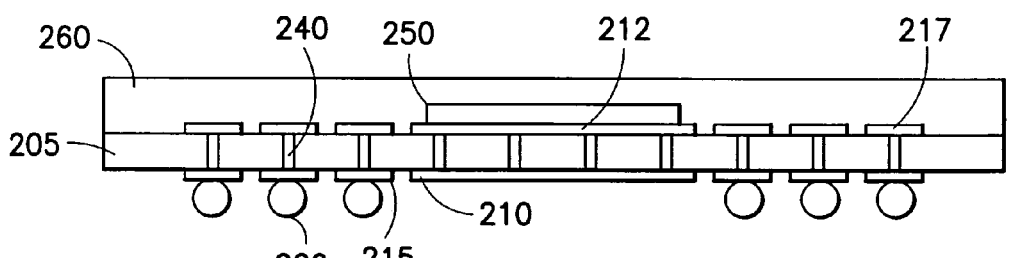
FIG. 4 shows a cross-sectional illustration of a conventional integrated circuit package.

FIG. 4 shows a cross-sectional illustration of a conventional integrated circuit. The substrate 205 has a top layer die pad area 212 and a bottom layer die pad area 210, mounted on substrate 205. Solder ball pads 215 support an associated thermally conductive solder ball 220, which disseminates thermal energy. Top layer via pads 217 are also shown. A corresponding via, through bore or hole 240 facilitates the dissemination of thermal energy by providing a path for the thermal energy through the substrate material 205. A die 250 and mold 260 are also shown. Heat transfer is limited to the die pad area in a conventional substrate without thermal balls.

Figure 5A:
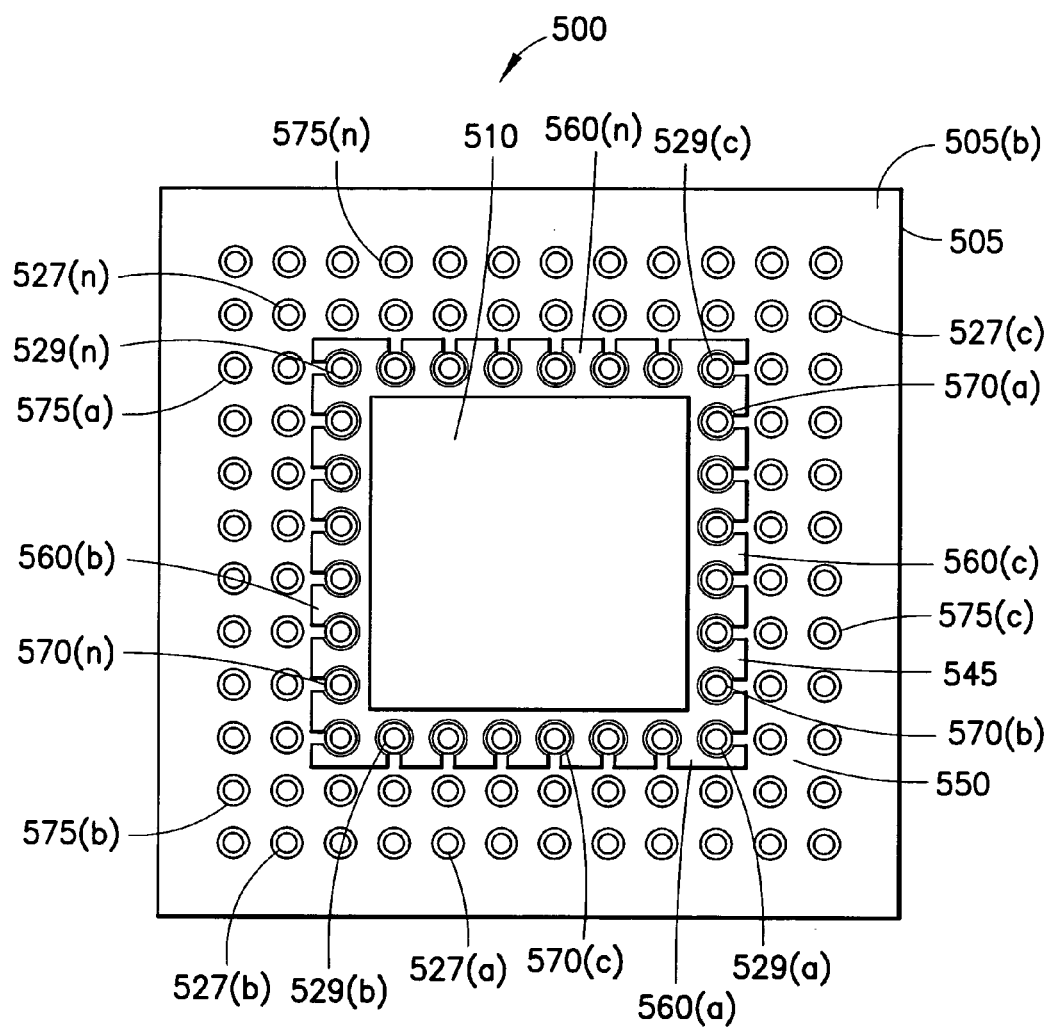
FIG. 5A shows a substrate, from the solder ball side, according to the present invention.

FIG. 5A shows a view 500 of a substrate, from the solder ball side, according to the present invention. Substrate 505 has a PWB facing surface 505(b) that has a first region 545 and a second region 550. The first region 545 includes the die pad area 510 and a first set of thermally conductive thermal finger elements, also referred to herein as relief structures, 560(a) . . . (n), where n is any number, that extend from the die pad to the area surrounding the first signal pad row. The die pad area 510 is adapted to support an IC chip thereon. The thermally conductive thermal finger elements 560 are adapted to connect to a solder ball, either for heat dissipation or signal transmission. First solder ball pads 570(a) . . . (n), generally 570, are found in the first signal pad row and second thermally conductive elements, 575(a) . . . (n), generally 575, which may also be solder ball pads or metal surface area, are disposed on the PWB facing surface 505(b).

A solder mask may be used to expose the solder ball pad surfaces, or the solder ball pads 570, 575 may be deposited on the surface 505(b) by chemical deposition, etching, stamping or other technique. The first solder ball pads 570 are located in proximity to the die pad area 510, which is shown as region 545 and the second solder ball pads 575(a) . . . (n)(generally 575) are located further away from the die pad area, in a region identified as 550. Typically solder balls, not shown, are mounted on the surface of the ball pads 570, 575.

Die pad mounting area 510 is disposed in the first region 545 of surface 505(b). A thermally and electrically conductive material, such as copper is disposed on the substrate. The thermally and electrically conductive material includes conductors, or fingers 560(a) . . . (n), where n is any suitable number, that extend from the die pad area to surround the area of the first signal pad row and include selected thermally conductive thermal finger elements, or solder ball pads. The selected thermally conductive thermal finger elements are typically first thermally conductive elements 570. Each finger 560 of the thermally and electrically conductive material is typically associated with a particular one of the first set of thermally conductive elements 570.

The thermally and electrically conductive material 545, 560, is typically formed by etching, stamping, photoresist, chemical vapor deposition, or other technique. Typically the first plurality of solder ball pads 570 are in contact with the thermal fingers 560, which are also referred to as extensions herein. Thus, the thermally conductive fingers 560 provide a path for thermal energy to dissipate from the die pad area 510 to the solder ball pads 570. While it is an embodiment of the present invention that a conductive thermal finger 560 is in contact with a corresponding thermally conductive element 570, it is also within the present invention that other designs and configurations may be used for the thermal fingers 560 to dissipate heat through the substrate 505. An advantage of the present invention is that electrical signal paths also serve as thermal conductive paths to dissipate or transfer thermal energy from the die pad area 510 to the substrate 505 and/or PWB.

The dimensions of the thermally conductive thermal fingers 560 are typically a function of the design of the package and can have a multitude of configurations. While it is shown in FIG. 5 that the thermal fingers 560 encompass a single adjacent row of solder ball pads, the invention is not limited to this configuration. Other exemplary configurations may include thermal finger elements encompassing a plurality of rows of solder ball pads as well as other designs.

Solder balls may be used for connecting with contacts on a printed circuit board, thereby forming electrical connections or thermal conductive junctions. The solder balls are typically fabricated from a material including a lead-tin alloy or copper, or copper-based alloy. First thermal balls may be attached to the respective first thermal ball pads, also referred to as thermally conductive elements or ball pads herein, 570 and corresponding contacts on the printed circuit board. Besides transferring the heat generated by a chip on the die pad area 510 away from the die pad area to the printed circuit board, the solder balls also form an electrical connection between the printed circuit board and the IC chip serving as ground or power point connections. Signal balls may also be attached to the ball pads 570 and corresponding contacts on the printed circuit board, thereby forming electrical connections for signal transmission such as input/output signals.

Vias, or through bores 529(a) . . . (n), where n is any suitable number, are disposed adjacent to the conductors or fingers 560 and provide a path for thermal energy and electrical current through the substrate 505. Typically each via 529 is associated with a corresponding thermal element 570. Additional, or second vias or through bores, shown as 527(a) . . . (n), are disposed on the second region 550 of substrate 505. Typically each second via 527 is associated with a corresponding one of the second set of thermally conductive elements, or ball pads, 575. The ball pads 575 are distinguished from ball pads 570 because ball pads 570 are associated with a conductive thermal finger element while ball pads 575 are not associated with a conductive thermal finger element. Additionally, optional thermal vias may also be used under the die pad area 510.

Figure 5B:
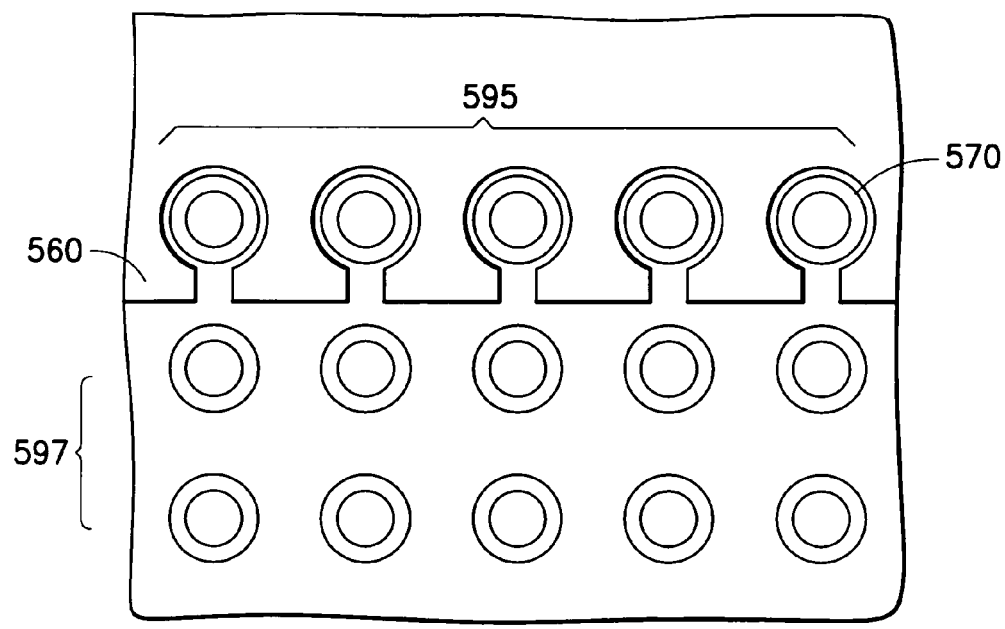
FIG. 5B shows a close up view of a first signal pad row.

FIG. 5B shows a close up view of the thermal finger elements 560 surrounding the first signal pad row 595. At least one additional signal pad row 597 is also shown.

Figure 5C:
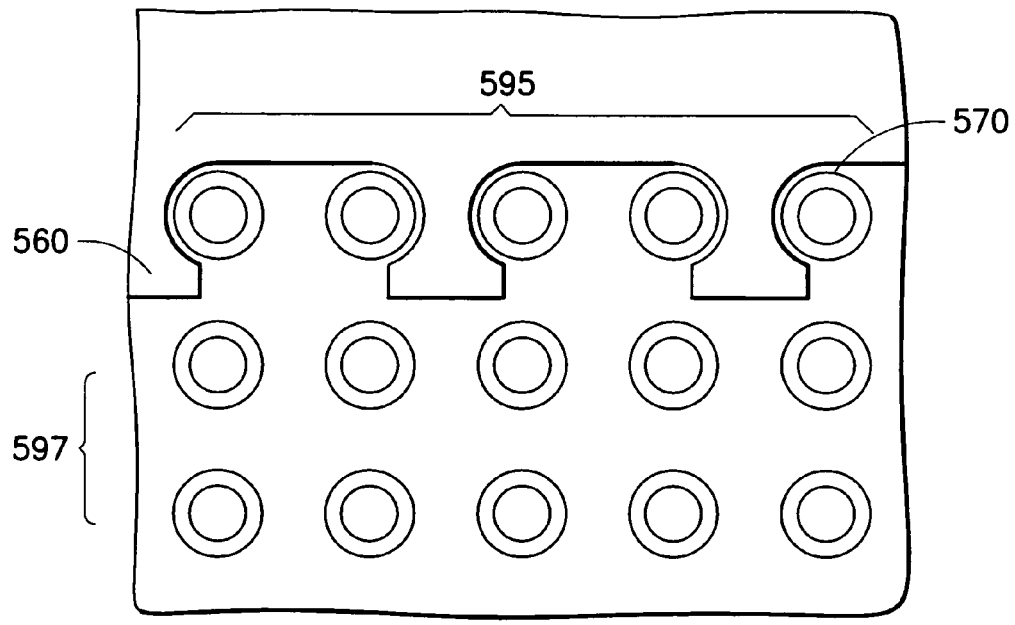
FIG. 5C shows a close up view of an alternate embodiment of the present invention.

FIG. 5C shows a close up view of an alternate embodiment of the thermal finger elements 560 wherein the thermal finger elements 560 surrounding the first signal pad row 595. At least one additional signal pad row 597 is also shown.

Figure 6:
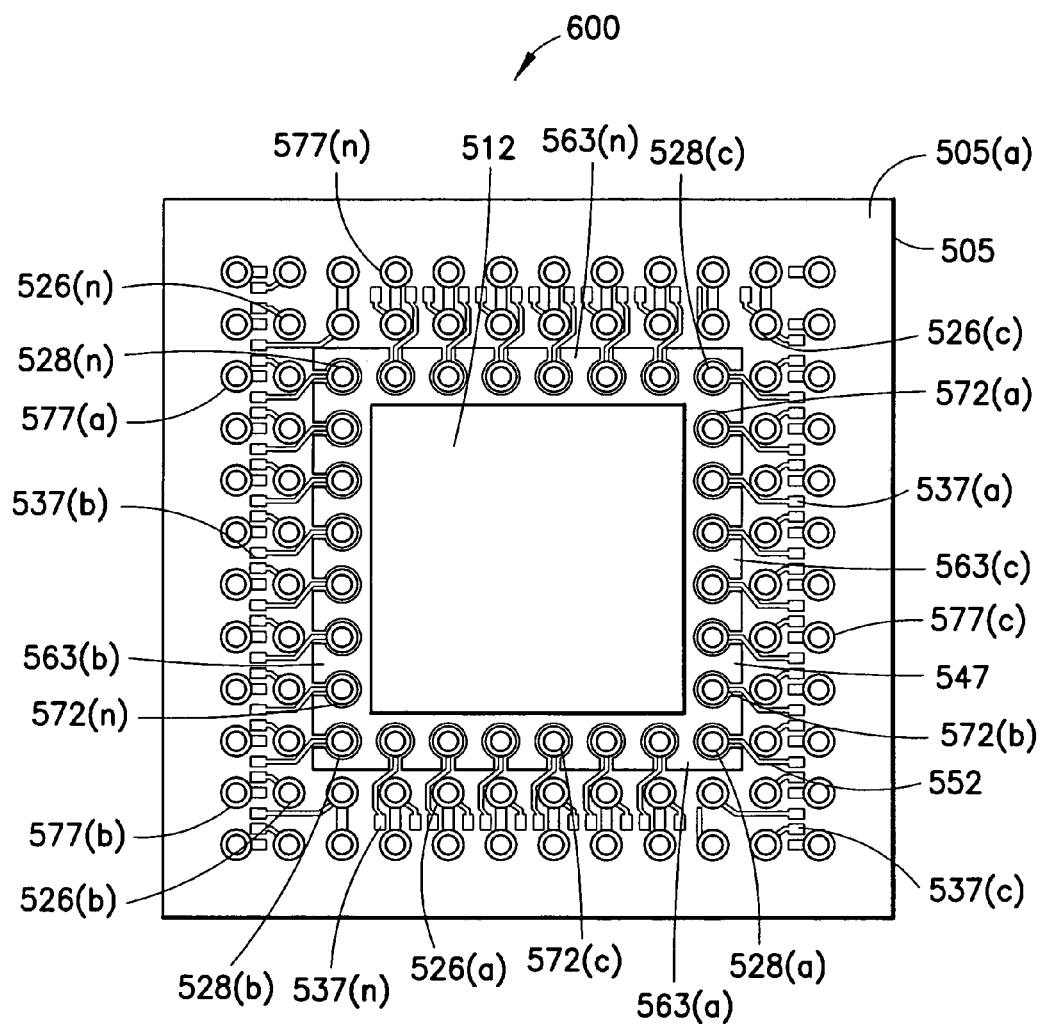
FIG. 6 shows a substrate, from the upper side, according to the present invention.

FIG. 6 shows a view 600 of substrate 505, from the top side, according to the present invention. Surface 505(a) has a die pad area 512 that has fingers, or extensions or conductors 563(a) . . . (n), generally 563, that surround the die pad area 512 to surround the area of the first signal pad row such that each thermal finger element 563 contacts a corresponding one of a first set of thermally conductive elements 572(a) . . . (n) (also referred to as solder ball pads, thermal ball pads or thermal pads herein). (The die pad area 512 shown in FIG. 6 is the die pad on surface 505(a) and is similar in dimension to die pad area 510 of surface 505(b), shown in FIG. 5. Also, thermal finger elements 563 shown in FIG. 6 may have similar dimensions to the thermal finger elements 560 shown in FIG. 5.) The thermal finger elements 563 enhance thermal dissipation from the die pad area 512 to the solder ball pads 572.

A second set of thermally conductive elements (also referred to as solder ball pads, ball pads, thermal ball pads or thermal balls herein) 577(a) . . . (n) are located in a second region 552, which is outside the first region 547. The thermally conductive elements 577 may be used to support a solder ball that is used for thermal or electrical conduction. Circuit traces, or pattern traces, 537(a) . . . (n), generally 537, which are used to conduct electrical current, are also shown. The substrate 505 typically has a laminated insulating layer. The insulating layer may be formed from a glass epoxy resin (FRA, FR-5), bismaleimide-triaze (BT) or epoxy resin. The pattern trace layer may be formed by depositing a conductive material such as copper, nickel, palladium, silver, nickel palladium alloy or alloys thereof. Alternatively, the pattern trace layer can be formed by a technique, such as photolithography, etching, plating or other chemical process, depending on design considerations.

Vias, or through bores, 526(a) . . . (n) and 528(a) . . . (n), are also shown in FIG. 6. These vias 526, 528 extend from surface 505(a) to surface 505(b), shown in FIG. 5.

Figure 7:
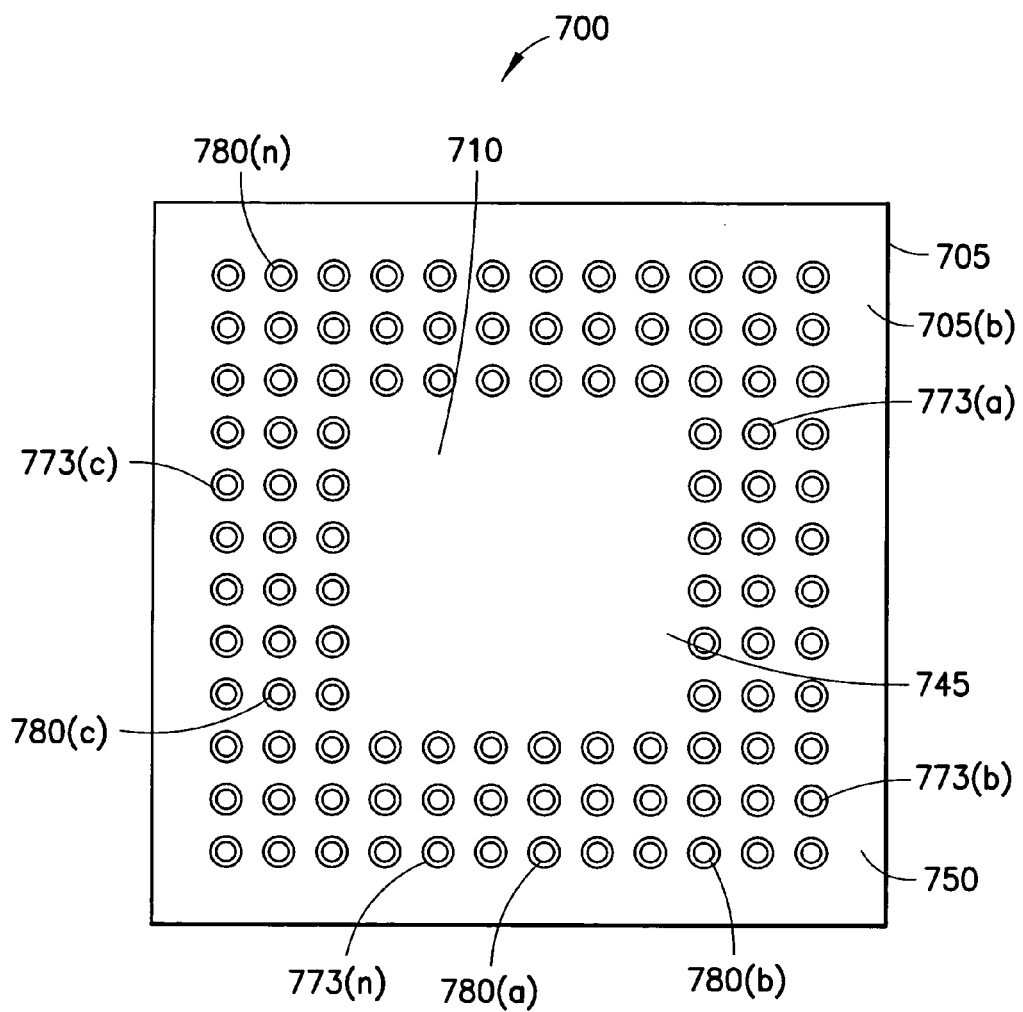
FIG. 7 shows an alternate embodiment substrate, from the solder ball side, according to the present invention.
Figure 8:
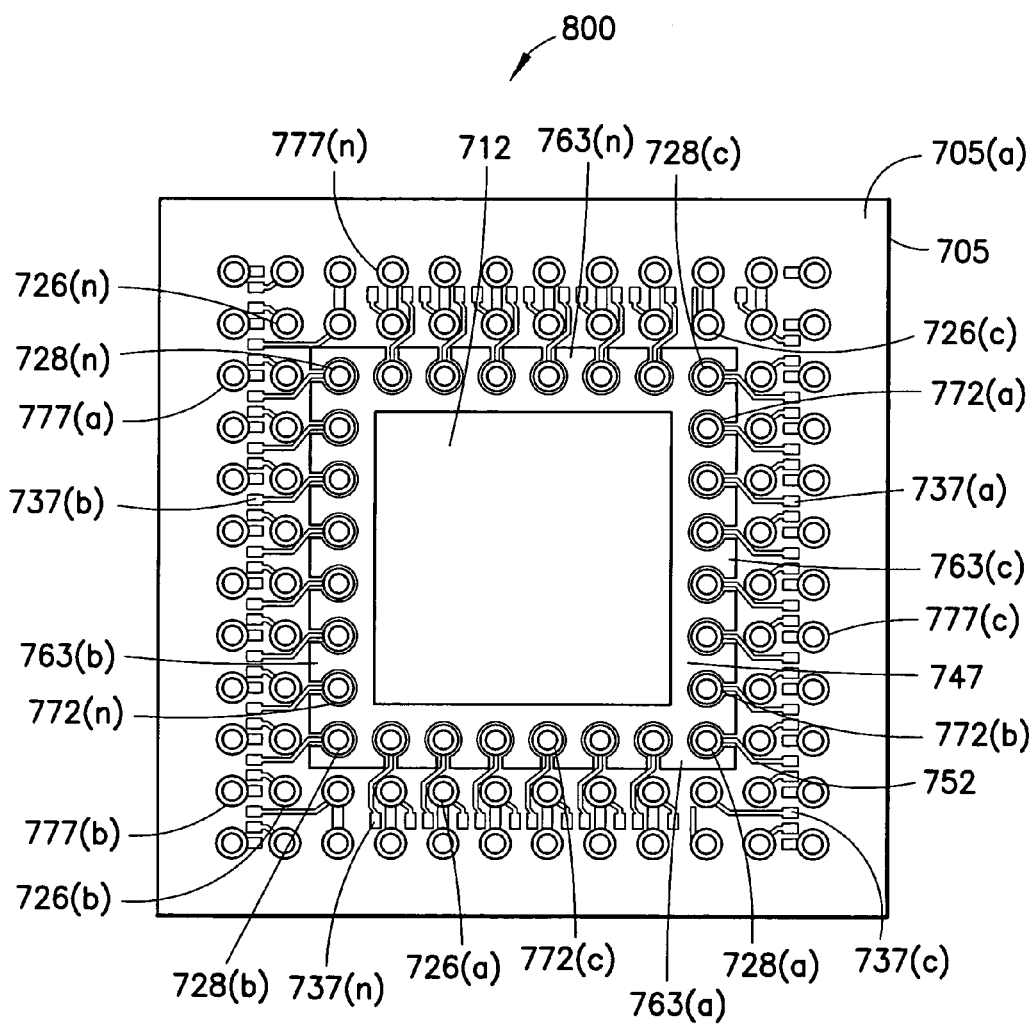
FIG. 8 shows an alternate embodiment substrate, from the upper side, according to the present invention.

FIG. 7 and 8 show the present invention with exemplary conductive layer configurations in the die pad area. These conductive layer configurations are alternate embodiments of the invention. The relationship between the conductive material and insulating material is a function of the design and application requirements.

FIG. 7 shows view 700 which includes substrate 705 having die pad area 710 and a second area 750, which is beyond the die pad area 710. Thermal pads, or solder ball pads, or conductive elements, generally 773 are in thermal and electrical contact with thermal finger elements which encompass the full net on the PWB facing side. The thermal effective area is extended from the upper die pad area to the PWB side using a continuous thermally conductive thermal plane while preserving the electrical integrity of individual signal pads. Vias, or through bores, 780(a) . . . (n) are also shown in FIG. 7. Optionally, vias may also be used under the die pad area. This embodiment is advantageous for use with NSMD structures.

FIG. 8 shows a view 800 of substrate 705, from the top side, according to the present invention. Surface 705(a) has a die pad area 712 that has thermal finger elements 763(a) . . . (d), generally 763, that are extended beyond the die pad area 712 and surround the area of the first signal pad row. The thermal finger elements 763 enhance thermal dissipation from the die pad area 712 to the PWB. Solder ball pads 772(a) . . . (n), generally 772, and 777(a) . . . (n), generally 777, are also shown as well as first and second areas 747 and 752, respectively. Vias, or through bores, 728(a) . . . (n), generally 728, and 726(a) . . . (n), generally 726, are also shown in FIG. 8. These vias 726, 728, extend from surface 705(a) to surface 705(b), shown in FIG. 7. Circuit traces, or pattern traces, 737(a) . . . (n), generally 737, which are used to conduct electrical current, are also shown.

Figure 9:
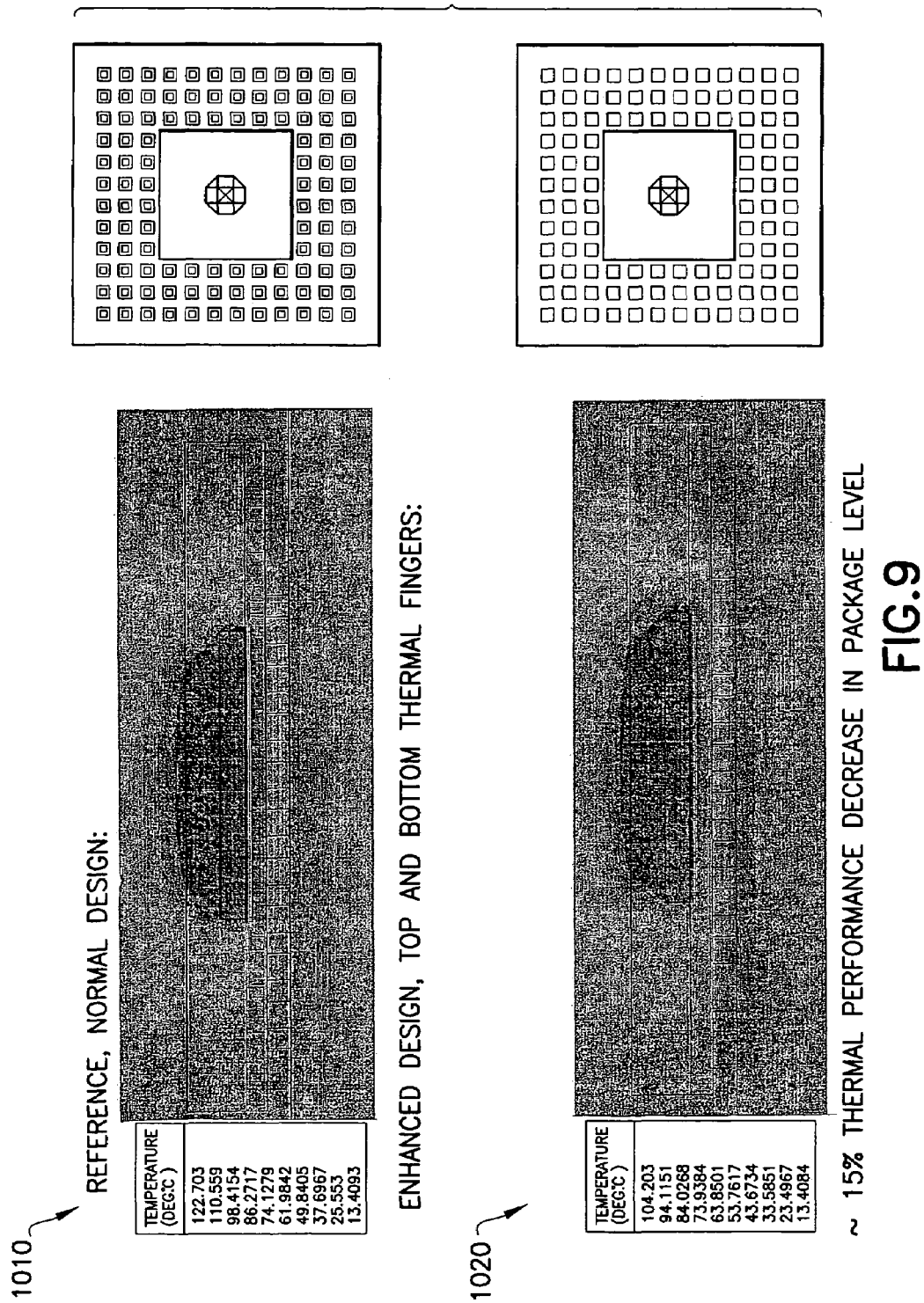
FIGS. 9–10 show thermal finger substrate simulation cases.

FIG. 9 shows a side view 1000 of the heat dissipation paths from a conventional IC package 1010 and from a thermal finger substrate IC package 1020. The operating temperature of the thermal finger substrate package 1020 is approximately 15% less than that of a conventional IC package 1010 providing improved heat dissipation in this case.

Figure 10:
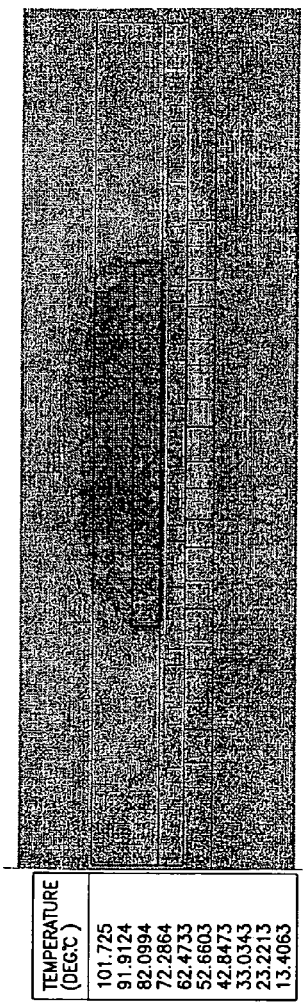
Figure 10:
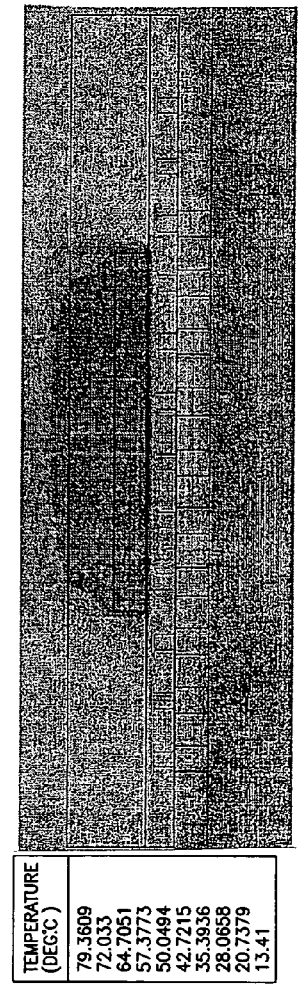

FIG. 10 shows a side view 1030 of the heat dissipation path from a thermal finger substrate with thermal vias under the die pad and a side view 1040 of the heat dissipation path from a thermal finger substrate with a full bottom net thermally conductive plane and thermal vias under the die pad. The operating temperature of the thermal finger substrate package with thermal vias 1030 is approximately 17% less than that of a conventional IC package, while the operating temperature of the thermal finger substrate package with a full bottom net and thermal vias under the die pad 1040 is approximately 35% less than that of a conventional IC package, providing improved heat dissipation in these cases.

The present invention addresses the need for the integrated circuit packages and MCM components to minimize thermal resistance from the die to the printed circuit board (PCB) by integrating the thermal and electrical function to the same pin and extending the thermally effective area of the package by integrating thermal heat transfer elements in the component substrate to maximize the indirect thermal path from under the die area to the surrounding signal pins while simultaneously adding/maximizing the die pad and the die flag areas to the package side direction.

The present invention integrates thermal heat transfer elements from under the die area by using copper fingers from the die pad and flag area to the surrounding area of the first signal pad row. The small area of the die can be extended by using a plurality of conductive elements, that are disposed at least partially around the die pad area, that extend from the die pad area and thus the thermally conductive area becomes wider and reduces overall thermal resistance of the package. The shape and dimensions of the conductive elements is a design choice. The conductive elements may underlie one another or they may be offset from one another. Specific dimensions of the conductive elements, or projections, are a function of the particular application and are subject to factors such as circuit parameters, component materials and environments.

The thermal conductivity element is integrated in the component at the same time when copper surfaces of the substrate are generated. The thermal indirect path is created by extending the die pad and/or die flag under the die area to the wider signaling area. The thermal vias conduct heat directly to the solder balls and to the PWB. Extra thermal vias may be used to enhance the thermal path between the die pad and the die flag areas. By connecting the die pad and the die flag areas to effective signals, for example, power or ground), the effective thermal dissipation area can be increased.

Some advantages of the present invention include: better thermal performance of the package; no addition to the cost of manufacturing work or materials; reduces the die shrink thermal effects; decreased thermal resistance of the package; increased package power; increased package reliability; effective when the die pad/solder pad overlapping is missing, no need for package changes when the die shrinks; no need for re-design of the PWB; less thermal sensitivity; robust assembly; and lower overall cost.

Additional advantages of the present invention include enhanced heat transfer under the die pad area by using copper fingers from the die pad and flag area to surround the area of the first signal pad row, internal thermal enhancement due to the wider copper area and improved indirect thermal contact to the signal pads.

In the present invention the thermal conductivity element is integrated in the component when copper surfaces of the substrate are generated. The thermal path is created by using copper fingers from the die pad/flag area to surround the area of the first signal pad row. The copper fingers conduct heat directly to the PWB. The present invention may be used with single layer and/or multilayer substrates.

An epoxy/solder resist coating may be used to isolate electrical contacts between the die and signals.

While the present invention has been described in terms of a "chip-up" configuration, it is also an embodiment of the present invention to utilize the heat dissipation technique in a "flip-chip" or chip-down configuration. Also, the chip may be encapsulated with an epoxy or resin.

While described in the context of an IC package, it should be appreciated that these teachings have applicability as well to other types of packaging in which heat dissipation is desired. Furthermore, it should be realized that the above teachings are exemplary, and are not to be construed in a limiting sense upon the practice of this invention.

What is claimed is:
1. An integrated circuit package comprising:
a substrate having a first surface and a second surface;
a first die pad area, disposed on said first surface, said die pad area having dimensions suitable to mount an integrated circuit thereon;
a plurality of thermally conductive signal elements disposed on the first surface of the substrate outside the die pad area, comprising a first signal pad row disposed between said die pad area and at least one additional signal pad row; and a first plurality of thermally conductive thermal fingers extending from said die pad area and thermally coupled thereto, at least one thermal finger at least partially encompassing in a non-contact manner at least some individual ones of the pads of the first signal pad row.

2. An integrated circuit package as in claim 1, further comprising:
a plurality of vias, one or more of the vias coupled to an associated signal element, the one or more vias providing at least thermal conductivity from the first surface of the substrate to the second surface of the substrate.

3. An integrated circuit package as in claim 1, wherein said second surface comprises a substantially continuous layer of thermally conductive material underlying said first die pad area and said first plurality of thermally conductive thermal fingers.

4. An integrated circuit package as in claim 1, further comprising an integrated circuit disposed on the die pad area.

5. An integrated circuit package as in claim 1, wherein the thermal fingers are thermally coupled to a plurality of electrical signal conveying vias disposed between said first and second surfaces.

6. An integrated circuit package comprising:
a substrate having a first surface and a second surface;
a first die pad area, disposed on said first surface, said die pad area having dimensions suitable to mount an integrated circuit thereon;
a plurality of thermally conductive signal elements disposed on the first surface of the substrate outside the die pad area, comprising a first signal pad row and at least one additional signal pad row;
a first plurality of thermally conductive thermal fingers extending from said die pad area and thermally coupled thereto, said thermal fingers encompassing at least some individual ones of the pads of the first signal pad row;
a second die pad, disposed on said second surface, said second die pad area underlying said first die pad area;
a second plurality of thermally conductive signal elements disposed on the second surface of the substrate outside the second die pad area, comprising a first signal pad row and at least one additional signal pad row; and
a second plurality of thermally conductive thermal fingers on said second surface extending from said second die pad area on the second surface and thermally coupled thereto, said thermal fingers encompassing at least some individual ones of the pads of the first signal pad row on said second surface.

7. An integrated circuit package as in claim 6, wherein the thermal fingers of the second surface are in registration with and underlie the thermal fingers on the first surface.

8. An integrated circuit package as in claim 6, wherein the thermal fingers of the second surface are offset from the thermal fingers on the first surface.

9. An integrated circuit package of claim 6, wherein the substrate is thermally coupled to a printed wiring board and the thermal energy is dissipated from the die pad area of the first surface to the die pad area of the second surface to the printed wiring board through said first and second thermal fingers.

10. An integrated circuit package comprising:
a substrate having a first surface and a second surface;
a first die pad area, disposed on said first surface, said die pad area having dimensions suitable to mount an integrated circuit thereon;
a plurality of thermally conductive signal elements disposed on the first surface of the substrate surrounding the die pad area, comprising a first signal pad row disposed between said die pad area and at least one additional signal pad row;
where an outer edge of said die pad area is formed to comprise a plurality of relief structures,
where at least some individual ones of said relief structures at least partially encompass in a non-contact manner at least one of said signal pads of said first signal pad row.

11. An integrated circuit package as in claim 10, wherein said second surface comprises a substantially continuous layer of thermally conductive material underlying said first die pad area and said first plurality of relief structures.

12. An integrated circuit package comprising:
a substrate having a first surface and a second surface;
a first die pad area, disposed on said first surface, said die pad area having dimensions suitable to mount an integrated circuit thereon:
a plurality of thermally conductive signal elements disposed on the first surface of the substrate surrounding the die pad area, comprising a first signal pad row and at least one additional signal pad row where an outer edge of said die pad area is formed to comprise a plurality of relief structures, where at least some individual ones of said relief structures at least partially surround at least one of said signal pads of said first signal pad row;
a second die pad, disposed on said second surface, said second die pad area underlying said first die pad area;
a second plurality of thermally conductive signal elements disposed on the second surface of the substrate surrounding the die pad area, comprising a first signal pad row and at least one additional signal pad row;
where an outer edge of said second die pad area is formed to comprise a plurality of relief structures, where at least some individual ones of said relief structures at least partially surround at least one of said signal pads of said first signal pad row on said second surface.

13. A method for dissipating thermal energy from a die pad comprising:
providing a substrate having a first surface and a second surface and a first thermally conductive die pad disposed on said first surface, said die pad comprising a first plurality of relief structures formed on an outer edge, where at least some individual ones of said relief structures at least partially encompass in a non-contact manner at least one signal pad of a first signal pad row on said first surface and are thermally coupled thereto; and
conveying thermal energy using a plurality of thermally conductive vias coupled to said signal pads, for providing thermal conductivity from the first surface of the substrate to the second surface of the substrate.

14. A method as in claim 13, wherein said second surface comprises a substantially continuous layer of thermally conductive material underlying said first die pad and said first plurality of thermally conductive relief structures.

15. A method as in claim 13, further comprising mounting an integrated circuit on the die pad.

16. A method as in claim 13, further comprising:
electrically isolating the plurality of thermally conductive relief structures from signal pads on the substrate.

17. A method for dissipating thermal energy from a die pad comprising:

provjding a substrate having a first surface and a second surface and a first thermally conductive die pad disposed on said first surface, said die pad comprising a first plurality of relief structures formed on an outer edge, where at least some individual ones of said relief structures at least partially surround at least one signal pad of a first signal pad row on said first surface and are thermally coupled thereto;

conveying thermal energy using a plurality of thermally conductive vias coupled to said signal pads, for providing thermal conductivity from the first surface of the substrate to the second surface of the substrate;

providing a second thermally conductive die pad disposed on said second surface, underlying said first die pad on said first surface, said die pad comprising a second plurality of relief structures formed on an outer edge, where at least some individual ones of said relief structures at least partially surround at least one second signal pad of a first signal pad row on said second surface and are thermally coupled thereto; and transferring thermal energy from the first surface to the second surface and to a printed wiring board.

18. A method as in claim 17, wherein selected vias are located under the die pad for conducting thermal energy from the first die pad to the second die pad to the printed wiring board.

* * * * *